US010585145B2

(12) United States Patent
Shirazi et al.

(10) Patent No.: US 10,585,145 B2
(45) Date of Patent: Mar. 10, 2020

(54) SYSTEM FOR DETECTING FAILURES ON A LINEAR MOTOR TRACK

(71) Applicant: Rockwell Automation Technologies, Inc., Mayfield Heights, OH (US)

(72) Inventors: Omid Shirazi, Brown Deer, WI (US); Nandini Ganesan, Milwaukee, WI (US); Patrick E. Ozimek, Milwaukee, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 297 days.

(21) Appl. No.: 15/703,188

(22) Filed: Sep. 13, 2017

(65) Prior Publication Data

US 2019/0079135 A1 Mar. 14, 2019

(51) Int. Cl.
*G01R 31/34* (2020.01)
*G01R 21/08* (2006.01)
*G01R 31/00* (2006.01)

(52) U.S. Cl.
CPC ............. *G01R 31/34* (2013.01); *G01R 21/08* (2013.01); *G01R 31/005* (2013.01)

(58) Field of Classification Search
CPC ....... G01R 31/34; G01R 31/005; G01R 21/08
See application file for complete search history.

(56) References Cited

U.S. PATENT DOCUMENTS

| 5,825,641 | A | 10/1998 | Mangtani | |
|---|---|---|---|---|
| 8,129,928 | B2* | 3/2012 | Shoda | H02P 5/68 318/135 |
| 2007/0007929 | A1* | 1/2007 | Lee | H02M 7/53875 318/802 |
| 2015/0060601 | A1* | 3/2015 | Nakagawa | B64C 13/50 244/99.2 |
| 2015/0115859 | A1* | 4/2015 | Stagg | H02P 7/28 318/504 |
| 2017/0075275 | A1* | 3/2017 | Chiba | G03G 15/2017 |
| 2017/0244314 | A1* | 8/2017 | Lee | H02M 7/44 |
| 2017/0288598 | A1* | 10/2017 | Cheng | H02P 29/10 |

* cited by examiner

*Primary Examiner* — Christopher P McAndrew
*Assistant Examiner* — Zannatul Ferdous
(74) *Attorney, Agent, or Firm* — Boyle Fredrickson S.C.

(57) ABSTRACT

Sections of a linear motor track can each include a single power sensor configured to detect a power current in an erroneous state and one or more reference sensors configured to detect reference currents in erroneous states. The power sensor can be arranged between multiple drive coils of a section and a DC power rail (or "mid-bus") for the drive coils. The power sensor can produce a single isolated output to a processor for the section, and the processor, in turn, can compare the output to a threshold for determining an error. The one or more reference sensors can be arranged between lower switches and a DC-reference bus, thereby providing a DC-referenced sensing signal for the drive coil currents. By referencing the processor to the same rail as the DC-referenced current sensing circuit, the reference sensors can produce outputs to the processor without any need for isolation.

17 Claims, 8 Drawing Sheets

SYSTEM FOR DETECTING FAILURES ON A LINEAR MOTOR TRACK

BACKGROUND INFORMATION

The present invention relates to motion control systems and, more specifically, to motion control systems including track segments for linear motor drive systems supporting moving vehicles on tracks in which sensors are arranged in each track segment to detect various short circuit conditions while requiring minimal hardware resources.

Motion control systems utilizing movers and linear motors can be used in a wide variety of processes (e.g., packaging, manufacturing, and machining) and can provide an advantage over conventional conveyor belt systems with enhanced flexibility, extremely high speed movement, and mechanical simplicity. The motion control system includes a set of independently controlled "movers" each supported on a track for motion along the track. The track is made up of a number of track segments or sections that, in turn, hold individually controllable electric coils. Successive activation of the coils establishes a moving electromagnetic field that interacts with the movers and causes the mover to travel along the trackTrack sensors, such as position magnets, may be spaced at fixed positions along the track and/or on the movers to provide information about the position and speed of the movers.

Each of the movers may be independently moved and positioned along the track in response to the moving electromagnetic field generated by the coils. In a typical system, the track forms a closed path over which each mover repeatedly travels. At certain positions along the track other actuators may interact with each mover. For example, the mover may be stopped at a loading station at which a first actuator places a product on the mover. The mover may then be moved along a process segment of the track where various other actuators may fill, machine, position, or otherwise interact with the product on the mover. The mover may be programmed to stop at various locations or to move at a controlled speed past each of the other actuators. After the various processes are performed, the mover may pass or stop at an unloading station at which the product is removed from the mover. The mover then completes a cycle along the closed path by returning to the loading station to receive another unit of the product.

A single DC (Direct Current) power supply is typically used to provide DC power to multiple track segments in the system. If an electrical failure occurs in the system, such as a short circuit between drive coils, DC power rails, or the like, the DC power supply may respond by deactivating and ceasing delivery of the DC power. However, it might not be apparent which track segment of the multiple track segments receiving the DC power, and/or, which portion of a track segment, caused the electrical failure to occur. While it may be possible to provide great numbers of sensors throughout the system to monitor for every conceivable electrical failure, it is desirable to provide a system for detecting the widest range of failures while more efficiently requires the least amount of hardware resources.

BRIEF DESCRIPTION

Sections of a linear motor track can each include a single power sensor configured to detect a power current in an erroneous state and one or more reference sensors configured to detect reference currents in erroneous states. The power sensor can be arranged between multiple drive coils of a section and a DC power rail (or "mid-bus") for the drive coils. The power sensor can produce a single isolated output to a processor for the section, and the processor, in turn, can compare the output to a threshold for determining an error. The one or more reference sensors can be arranged between lower switches and a DC-reference bus, thereby providing a DC referenced sensing signal for the drive coil currents. By referencing the processor to the same rail as the DC-referenced current sensing circuit, the reference sensors can produce outputs to the processor without any need for isolation.

As a result, numerous short circuit conditions can be detected at each section while requiring minimal hardware resources. For example, by including the single power sensor (or "mid-bus sensor") at each section, short circuit conditions which may be detected can include: (1) electrical shorts between a drive coil (or "phase") and ground, such as electrical shorts between a drive coil and the chassis; (2) electrical shorts between a drive coil and a DC power rail which could be switched to the drive coil, such as the DC reference voltage ("DC-") or "full-bus" DC power rails. Also, by including the reference sensors (or "emitter-shunt sensors") at each section, short circuit conditions which may be detected can include: (1) electrical shorts between drive coils at connections proximal to the DC power rail which could be switched to the drive coil, such as the DC- or "full-bus" DC power rails; and/or (2) electrical shorts between DC- and the full-bus DC power rail. Accordingly, a wide variety of fault conditions can be detected by processors in sections receiving outputs from the sensors by providing only a single sensor (the power sensor) between the drive coils and the mid-bus DC power rail and reference sensors between lower switches and DC-providing the DC-referenced sensing signal for the drive coil currents. Also, by referencing the processor to the same DC-reference voltage, isolation circuitry can be significantly reduced to just isolation for the single power sensor.

In one aspect, the single power sensor, which can be located in the mid-bus DC power rail of the section, can detect a drive coil to ground failure and/or a failure of an upper switch to the full bus DC power rail, whereas the reference sensors, which are located between the lower switches to the DC-reference voltage rail, can detect an upper switch short only when the lower switch is activated.

In another aspect, multiple power sensors can be used, with each power sensor providing current sensing for two or more drive coils. This can still result in an overall reduction of isolators, increases fault detection of the system, and may allow for more compact implementation.

Specifically then, one aspect of the present invention provides: a first DC voltage rail configured to provide DC power; a second DC voltage rail configured to provide half DC power; a third DC voltage rail configured to provide a DC-reference; multiple drive coils spaced along the track segment, the multiple drive coils being coupled to the second DC voltage rail; multiple lower switches in communication with the multiple drive coils, the multiple lower switches being coupled to the third DC voltage rail, in which each switch of the multiple lower switches is configured to connect a drive coil of the multiple drive coils to the third DC voltage rail in a first state or disconnect the drive coil of the multiple drive coils from the third DC voltage rail in a second state; multiple upper switches in communication with the multiple drive coils, the multiple upper switches being coupled to the first DC voltage rail, in which each switch of the multiple upper switches is configured to connect a drive coil of the multiple drive coils to the first DC voltage rail in the second state or disconnect the drive coil of the multiple drive coils from the first DC voltage rail in the first state; and a sensor arranged between the multiple drive coils and the second DC voltage rail, the sensor being configured to produce an output corresponding to a current between the multiple drive coils and the second DC voltage rail.

Another aspect of the present invention provides: a track segment for a linear motor drive system, the track segment including: a first DC voltage rail configured to provide DC power; a second DC voltage rail configured to provide half DC reference; a third DC voltage rail configured to provide a DC-reference; multiple drive coils spaced along the track segment, the multiple drive coils being coupled to the second DC voltage rail; multiple lower switches in communication with the multiple drive coils, the multiple lower switches being coupled to the third DC voltage rail, in which each switch of the multiple lower switches is configured to connect a drive coil of the multiple drive coils to the third DC voltage rail in a first state or disconnect the drive coil of the multiple drive coils from the third DC voltage rail in a second state; multiple upper switches in communication with the multiple drive coils, the multiple upper switches being coupled to the first DC voltage rail, in which each switch of the multiple upper switches is configured to connect a drive coil of the multiple drive coils to the first DC voltage rail in the second state or disconnect the drive coil of the multiple drive coils from the first DC voltage rail in the first state; multiple DC reference sensors arranged between the multiple lower switches and the third DC voltage rail, each DC reference sensor of the multiple DC reference sensors being configured to produce an output corresponding to a current between a switch of the multiple lower switches and the third DC voltage rail; and a DC power sensor arranged between the multiple drive coils and the second DC voltage rail, the DC power sensor being configured to produce an output corresponding to a current between the multiple drive coils and the second DC voltage rail.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which:

FIG. 1.

Figure 1:
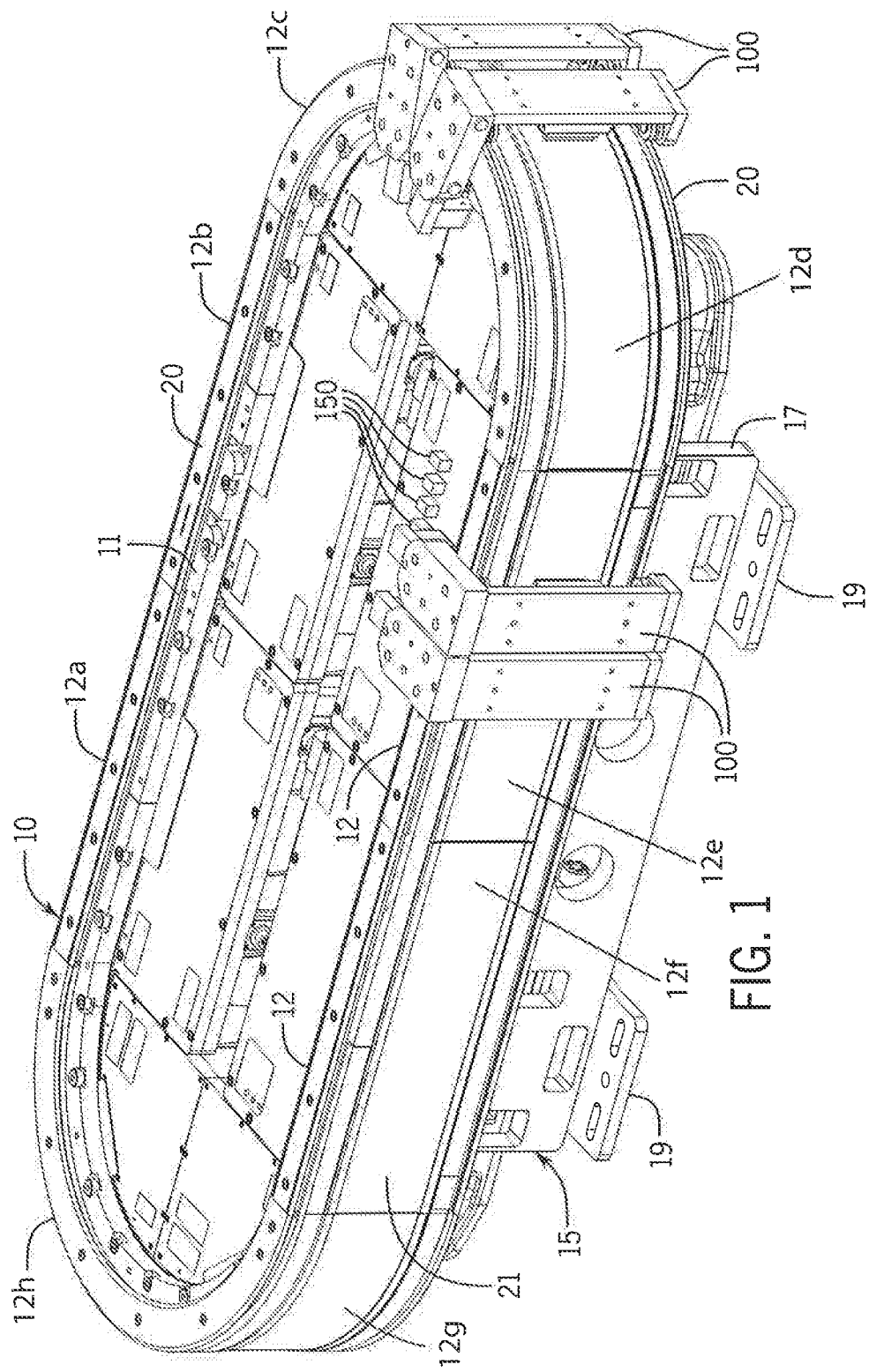
FIG. 1 is an isometric view of an exemplary transport system incorporating multiple movers travelling along a closed curvilinear track according to one embodiment of the present invention.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

Turning initially to FIG. 1, an exemplary transport system for moving articles or products includes a track 10 made up of multiple segments 12 or sections, such as segments 12a, 12b, 12c and so forth. According to the illustrated embodiment, the segments 12 define a generally closed loop supporting a set of movers 100 movable along the track 10. The track 10 is oriented in a horizontal plane and supported above the ground by a base 15 extending vertically downward from the track 10. According to the illustrated embodiment, the base 15 includes a pair of generally planar support plates 17, located on opposite sides of the track 10, with mounting feet 19 on each support plate 17 to secure the track 10 to a surface. The illustrated track 10 includes four straight segments 12, with two straight segments 12 located along each side of the track and spaced apart from the other pair, such as straight segments 12a and 12b on a first side of the track 10, opposite straight segments 12e and 12f on a second side of the track 10. The track 10 also includes four curved segments 12 where a pair of curved segments 12 is located at each end of the track 10 to connect the pairs of straight segments 12, such as curved segments 12c and 12d on a first end of the track, opposite curved segments 12g and 12h on a second end of the track 10. As illustrated, the four straight segments 12 and the four curved segments 12 form a generally oval track and define a closed surface over which each of the movers 100 may travel. It is understood that track segments of various sizes, lengths, and shapes may be connected together to form a track 10 without deviating from the scope of the invention.

For convenience, the horizontal orientation of the track 10 shown in FIG. 1 will be discussed herein. Terms such as upper, lower, inner, and outer will be used with respect to the illustrated track orientation. These terms are relational with respect to the illustrated track and are not intended to be limiting. It is understood that the track may be installed in different orientations, such as sloped or vertical, and include different shaped segments including, but not limited to, straight segments, inward bends, outward bends, up slopes, down slopes and various combinations thereof. Further, each track segment 12 is shown in a generally horizontal orientation. The track segments 12 may also be oriented in a generally vertical orientation and the width of the track 10 may be greater in either the horizontal or vertical direction according to application requirements. The movers 100 will travel along the track and take various orientations according to the configuration of the track 10 and the relationships discussed herein may vary accordingly.

Figure 3:
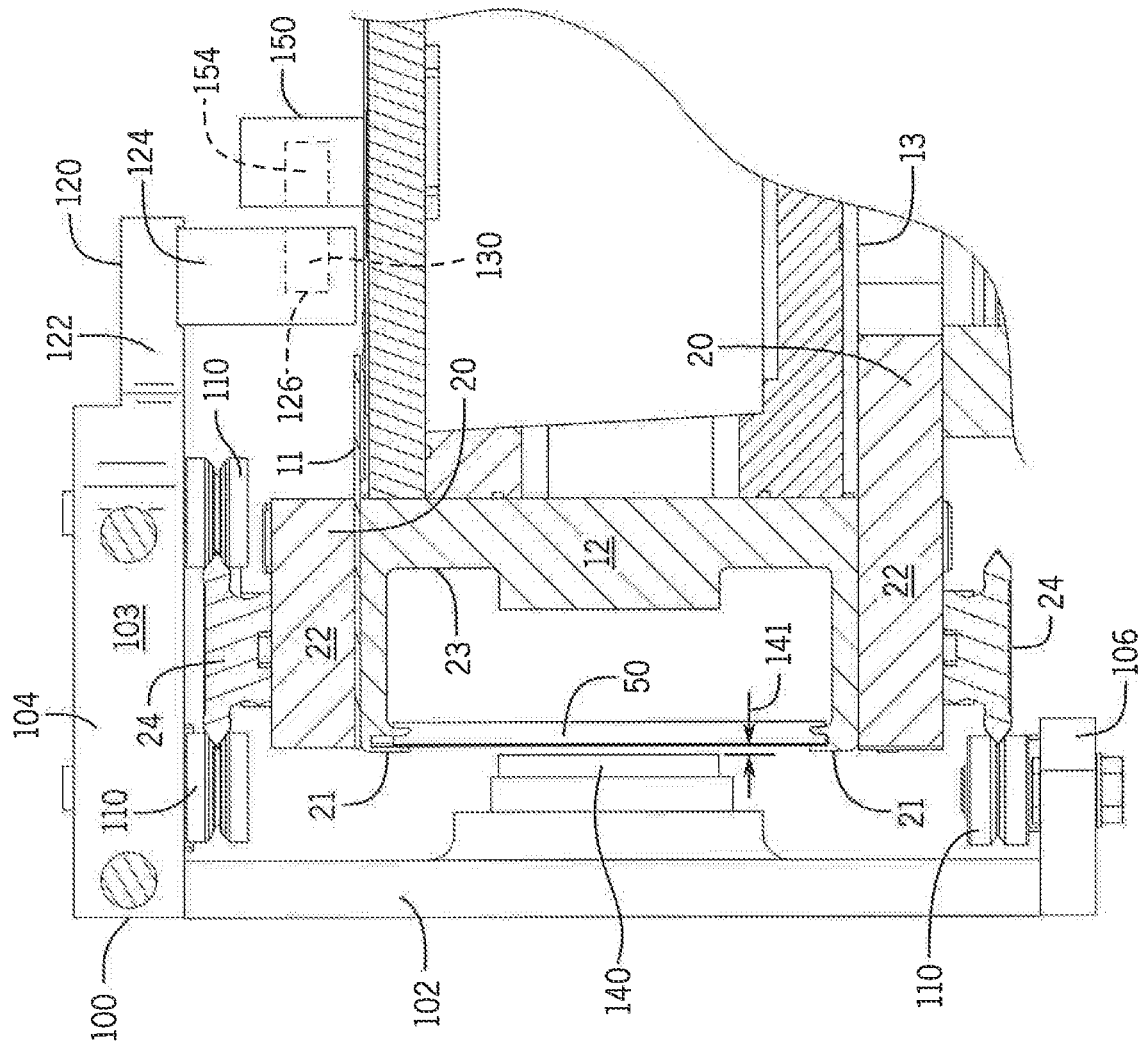
FIG. 3 is a partial sectional view of the transport system of FIG. 1.

Each track segment 12 includes a number of independently attached rails 20 on which each mover 100 runs. According to the illustrated embodiment, rails 20 extend generally along the outer periphery of the track 10. A first rail 20 extends along an upper surface 11 of each segment and a second rail 20 extends along a lower surface 13 of each segment. With reference also to FIG. 3, the illustrated embodiment of each rail 20 includes a base 22 and a track portion 24. The base 22 is secured to the upper surface 11 or lower surface 13 of each segment 12 and the track portion 24 is mounted to the base 22. It is contemplated that each rail 20 may be a singular, molded or extruded member or formed from multiple members. It is also contemplated that the cross section of the rails 20 may be circular, square, rectangular, or any other desired cross-sectional shape without deviating from the scope of the invention. The rails 20 generally conform to the curvature of the track 10 thus extending in a straight path along the straight track segments 12 and in a curved path along the curved track segments 12. The rails 20 may be thin with respect to the width of the track 10 and span only a partial width of the surface of the track 10 on which it is attached. Each mover 100 includes complementary rollers 110 to engage the track portion 24 of the rail 20 for movement along the track 10.

Figure 4:
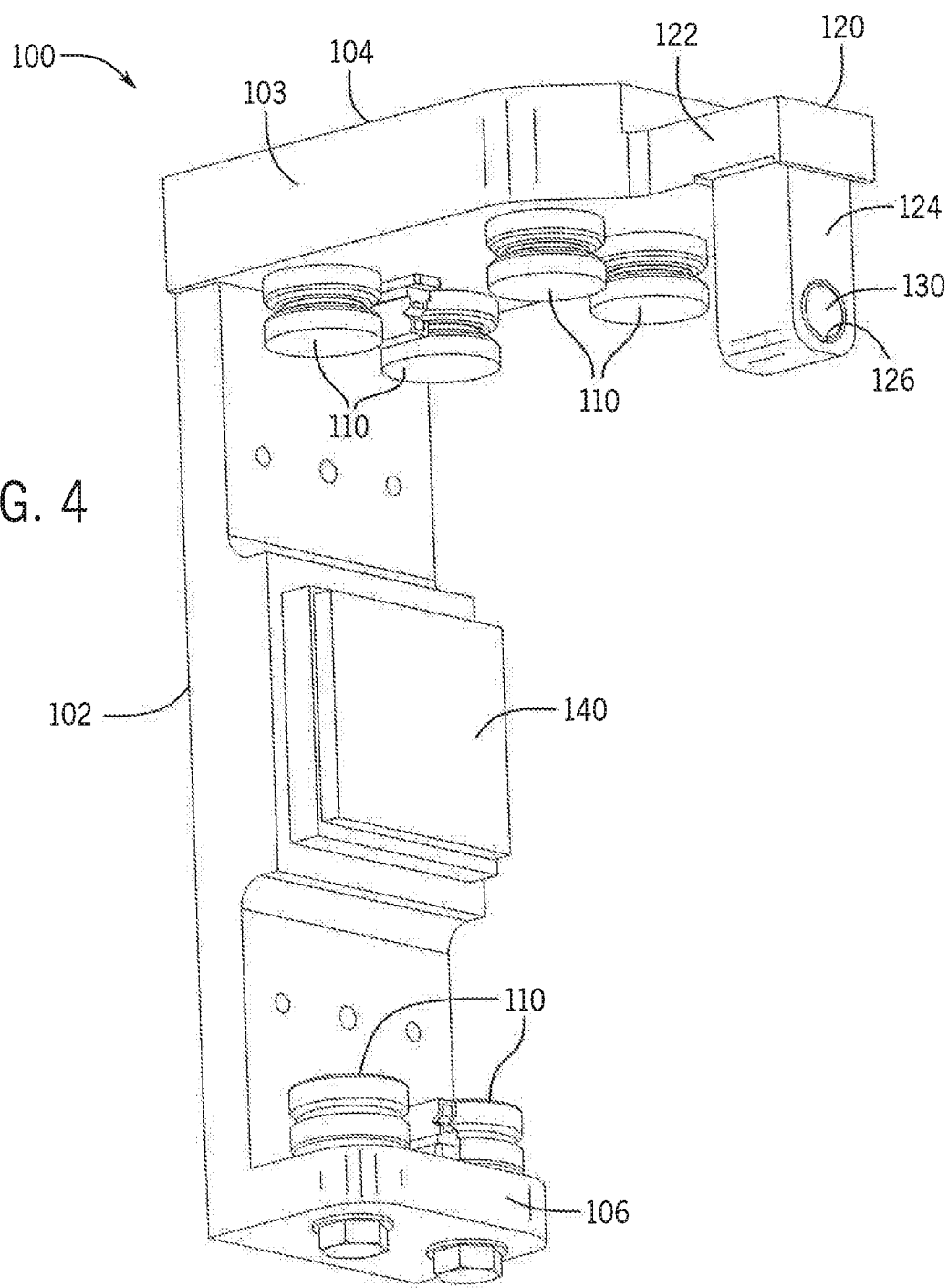
FIG. 4 is an isometric view of a mover from the transport system of FIG. 1.
Figure 5:
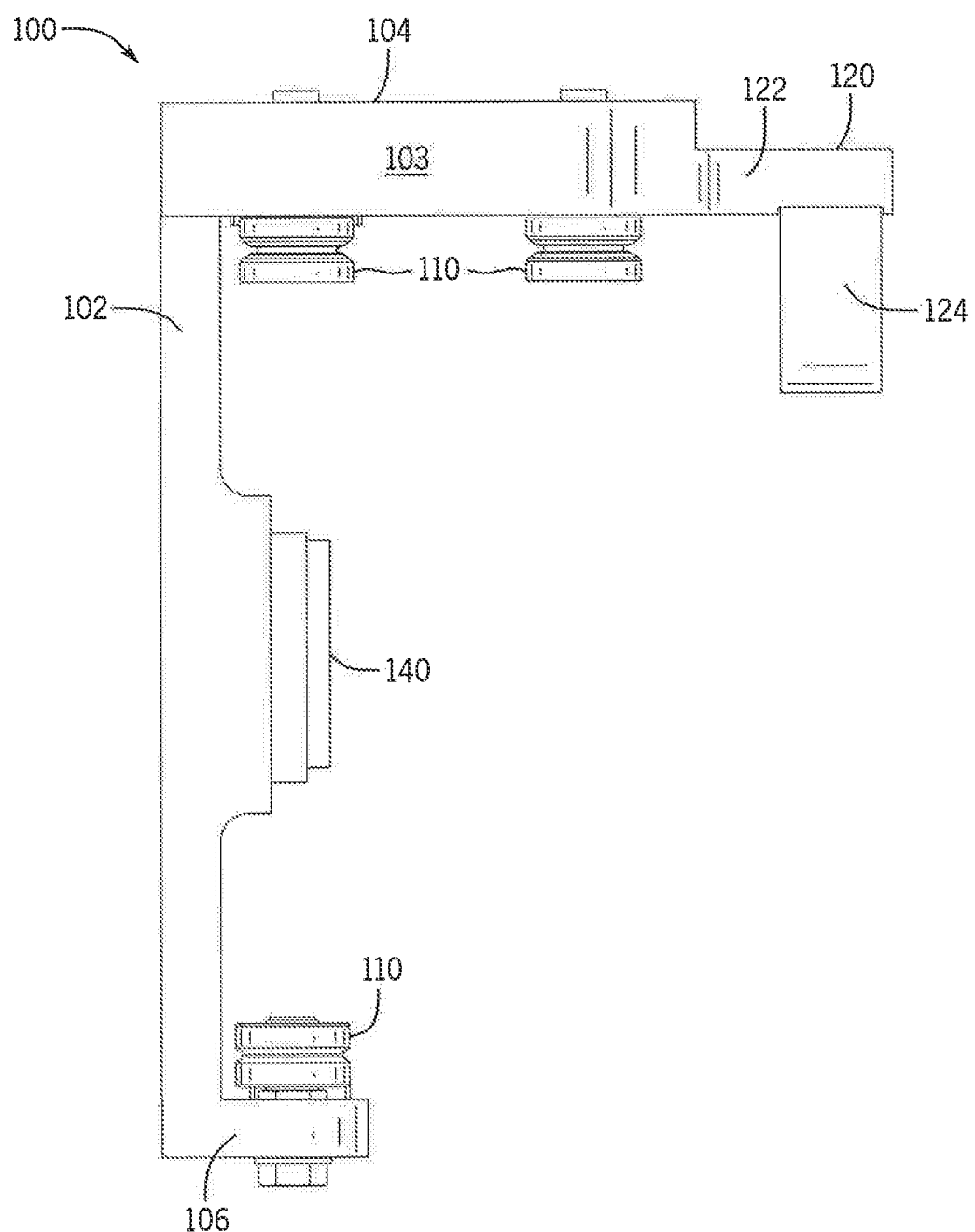
FIG. 5 is a side elevation view of the mover of FIG. 4.
Figure 6:
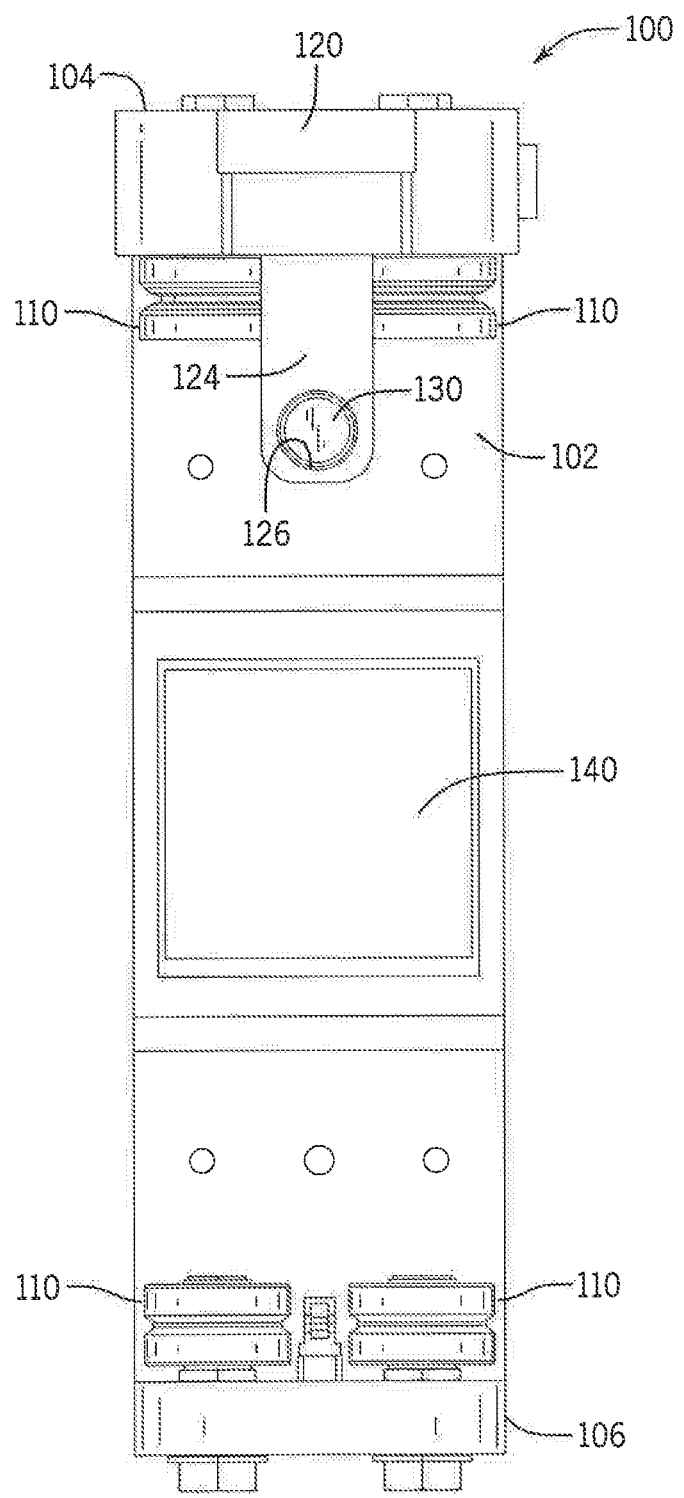
FIG. 6 is a front elevation view of the mover of FIG. 4.

One or more movers 100 are mounted to and movable along the rails 20 on the track 10. With reference next to FIGS. 4-6, an exemplary mover 100 is illustrated. Each mover 100 includes a side member 102, a top member 104, and a bottom member 106. The side member 102 extends for a height at least spanning a distance between the rail 20 on the top surface 11 of the track 10 and the rail 20 on the bottom surface 13 of the track 10 and is oriented generally parallel to a side surface 21 when mounted to the track 10. The top member 104 extends generally orthogonal to the side member 102 at a top end of the side member 102 and extends across the rail 20 on the top surface 11 of the track 10. The top member 104 includes a first segment 103, extending orthogonally from the side member 102 for the width of the rail 20, which is generally the same width as the side member 102. A set of rollers 110 are mounted on the lower side of the first segment 103 and are configured to engage the track portion 24 of the rail 20 mounted to the upper surface 11 of the track segment. According to the illustrated embodiment two pairs of rollers 110 are mounted to the lower side of the first segment 103 with a first pair located along a first edge of the track portion 24 of the rail and a second pair located along a second edge of the track portion 24 of the rail 20. The first and second edges and, therefore, the first and second pairs of rollers 110 are on opposite sides of the rail 20 and positively retain the mover 100 to the rail 20. The bottom member 106 extends generally orthogonal to the side member 102 at a bottom end of the side member 102 and extends for a distance sufficient to receive a third pair of rollers 110 along the bottom of the mover 100. The third pair of rollers 110 engage an outer edge of the track portion 24 of the rail 20 mounted to the lower surface 13 of the track segment. Thus, the mover 100 rides along the rails 20 on the rollers 110 mounted to both the top member 104 and the bottom member 106 of each mover 100. The top member 104 also includes a second segment 120 which protrudes from the first segment 103 an additional distance beyond the rail 20 and is configured to hold a position magnet 130. According to the illustrated embodiment, the second segment 120 of the top member 104 includes a first portion 122 extending generally parallel to the rail 20 and tapering to a smaller width than the first segment 103 of the top member 104. The second segment 120 also includes a second portion 124 extending downward from and generally orthogonal to the first portion 122. The second portion 124 extends downward a distance less than the distance to the upper surface 11 of the track segment but of sufficient distance to have the position magnet 130 mounted thereto. According to the illustrated embodiment, a position magnet 130 is mounted within a recess 126 on the second portion 124 and is configured to align with a track sensor 150 mounted to the top surface 11 of the track segment.

Figure 2:
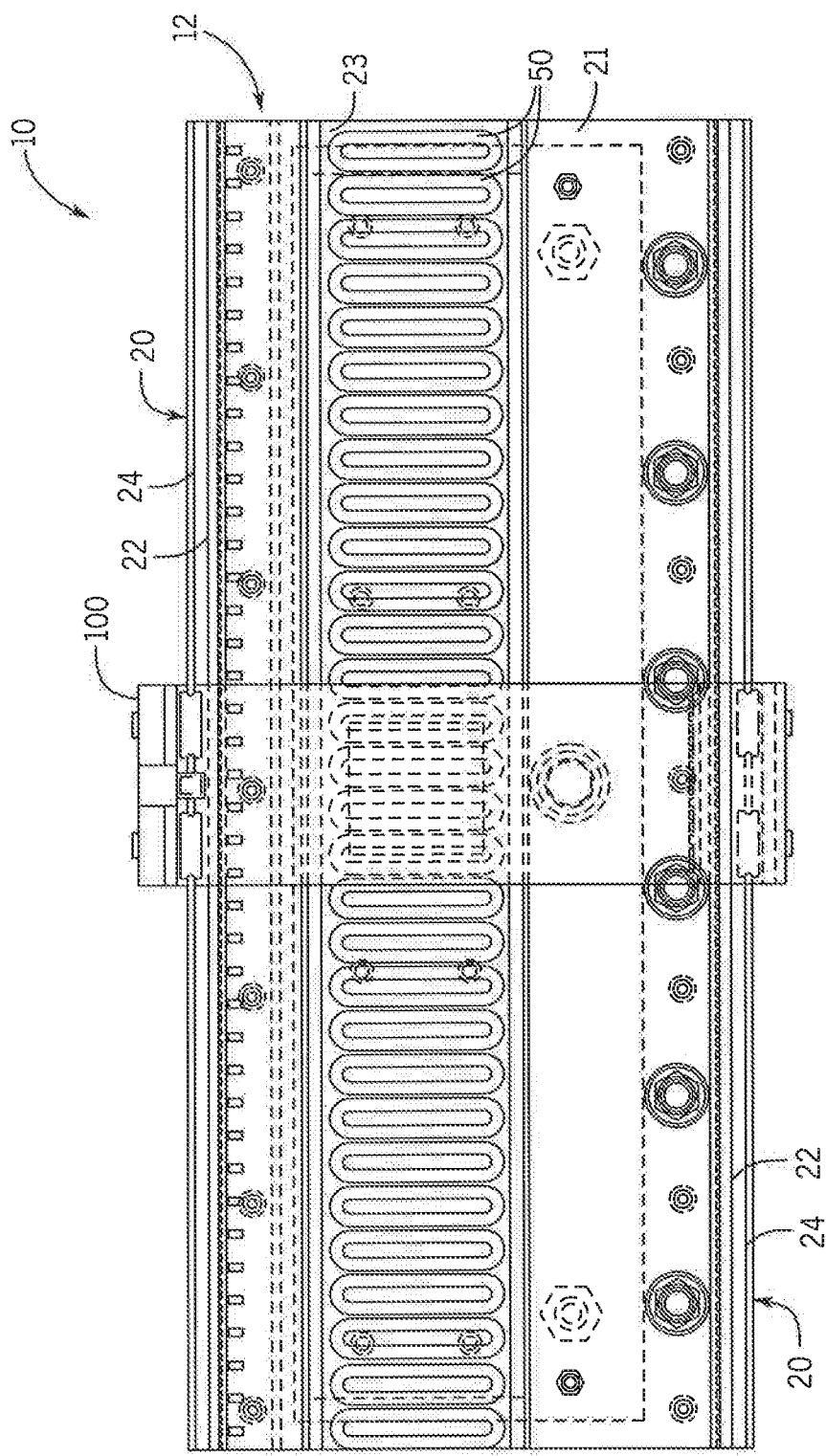
FIG. 2 is a partial side elevation view of one segment of the transport system of FIG. 1 illustrating activation coils distributed along one surface of the track segment.

A linear drive system is incorporated in part on each mover 100 and in part within each track segment 12 to control motion of each mover 100 along the segment. On each mover 100, the linear drive system includes multiple drive magnets 140 mounted to the side member 102. The drive magnets 140 can be arranged in a block along an inner surface of the side member 102 with separate magnet segments alternately having a north pole, N, and south pole, S, pole facing the track segment. The drive magnets 140 are typically permanent magnets, and two adjacent magnet segments including a north pole and a south pole may be considered a pole-pair. The drive magnets 140 are mounted on the inner surface of the side member 102 and when mounted to the track 10 are spaced apart from a series of coils 50 extending along the track 10. As shown in FIG. 3, an air gap 141 is provided between each set of drive magnets 140 and the coils 50 along the track 10. On the track 10, the linear drive system includes a series of parallel coils 50 spaced along each track segment 12 as shown in FIG. 2. According to the illustrated embodiment, each coil 50 is placed in a channel 23 extending longitudinally along one surface of the track segment 12. The electromagnetic field generated by each coil 50 spans the air gap and interacts with the drive magnets 140 mounted to the mover 100 to control operation of the mover 100.

Figure 7:
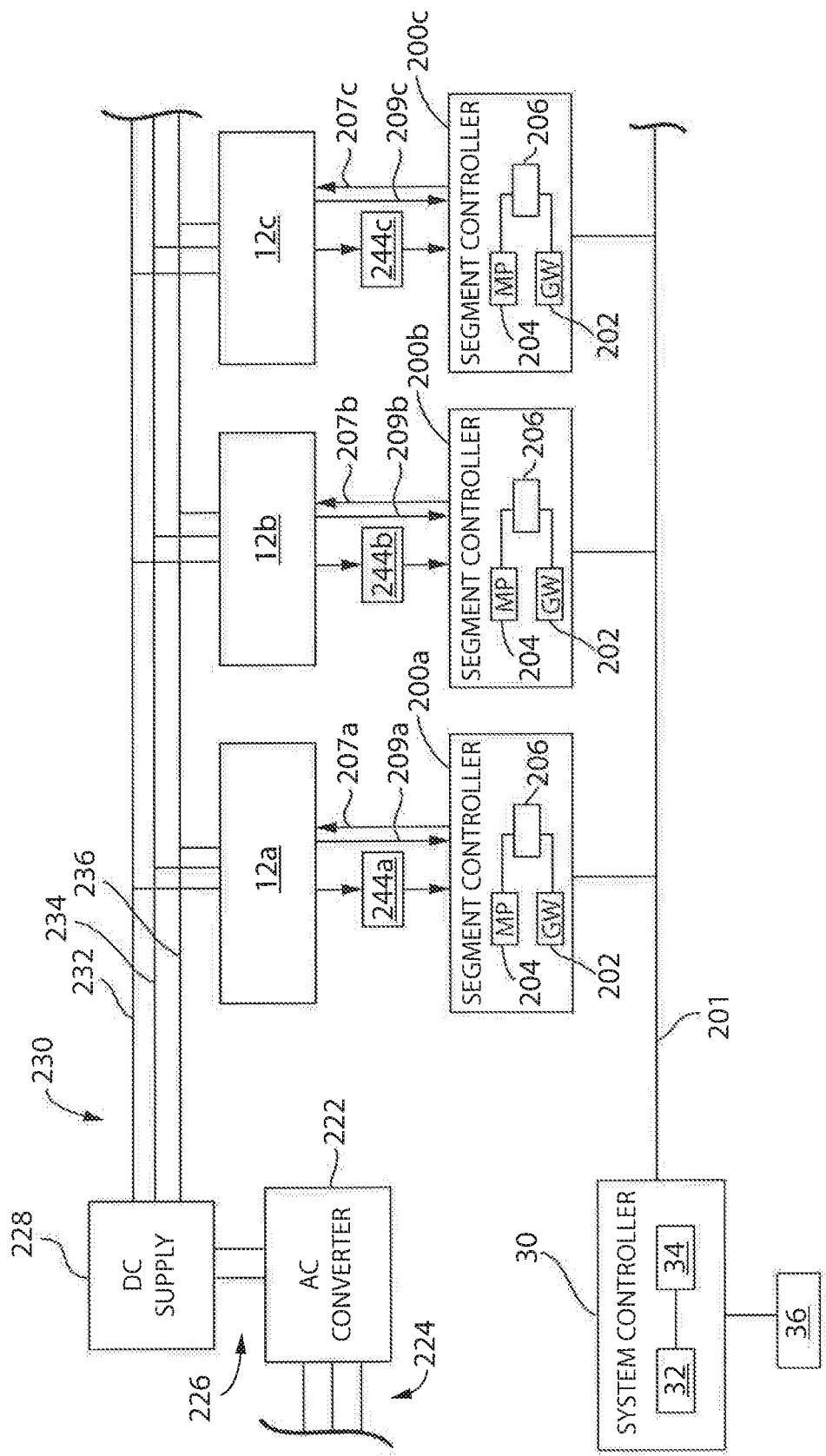
FIG. 7 is a block diagram representation of an exemplary power and control system for the transport system.

Turning next to FIG. 7, an exemplary power and control system for the track 10 and linear drive system is illustrated. A segment controller 200 is mounted within each track segment 12. The segment controller 200 receives command signals from a system controller 30 and generates switching signals for power segments 210 (FIG. 8) which, in turn, control activation of each coil 50. Activation of the coils 50 are controlled to drive and position each of the movers 100 along the track segment 12 according to the command signals received from the system controller 30.

The illustrated motion control system includes a system controller 30 having a processor 32 and a memory device 34. It is contemplated that the processor 32 and memory device 34 may each be a single electronic device or formed from multiple devices. The processor 32 may be a microprocessor. Optionally, the processor 32 and/or the memory device 34 may be integrated on a field programmable array (FPGA) or an application specific integrated circuit (ASIC). The memory device 34 may include volatile memory, non-volatile memory, or a combination thereof. The system controller 30 could be a Programmable Logic Controller (PLC). A user interface 36 is provided for an operator to configure the system controller 30 and to load or configure desired motion profiles for the movers 100 on the system controller 30. It is contemplated that the system controller 30 and user interface 36 may be a single device, such as a laptop, notebook, tablet or other mobile computing device.

Optionally, the user interface 36 may include one or more separate devices such as a keyboard, mouse, display, touchscreen, interface port, removable storage medium or medium reader and the like for receiving information from and displaying information to a user. Optionally, the system controller 30 and user interface 36 may be integrated into an industrial computer mounted within a control cabinet and configured to withstand harsh operating environments. It is contemplated that still other combinations of computing devices and peripherals as would be understood in the art may be utilized or incorporated into the system controller 30 and user interface 36 without deviating from the scope of the invention.

One or more programs may be stored in the memory device 34 for execution by the processor 32. The system controller 30 receives one or more motion profiles for the movers 100 to follow along the track 10. A program executing on the processor 32 is in communication with a segment controller 200 on each track segment 12 via a control network 201, such as an EtherNet/IP network. The system controller 30 may transfer a desired motion profile to each segment controller 200 or, optionally, the system controller 30 may perform some initial processing based on the motion profile to transmit a segment of the motion profile to each segment controller 200 according to the portion of the motion profile to be executed along that segment. Optionally, the system controller 30 may perform still further processing on the motion profile and generate a desired switching sequence for each segment 12 that may be transmitted to the segment controller 200.

A gateway 202 in each segment controller 200 receives the communications from the system controller 30 and passes the communication to a processor 204 executing in the segment controller 200. The processor may be a microprocessor. Optionally, the processor 204 and/or a memory device 206 within the segment controller 200 may be integrated on a field programmable array (FPGA) or an application specific integrated circuit (ASIC). It is contemplated that the processor 204 and memory device 206 may each be a single electronic device or formed from multiple devices. The memory device 206 may include volatile memory, non-volatile memory, or a combination thereof. The segment controller 200 receives the motion profile, or portion thereof, or the switching sequence transmitted from the system controller 30 and utilizes the motion profile or switching sequence to control movers 100 present along the track segment 12 controlled by that system controller 30.

Figure 8:
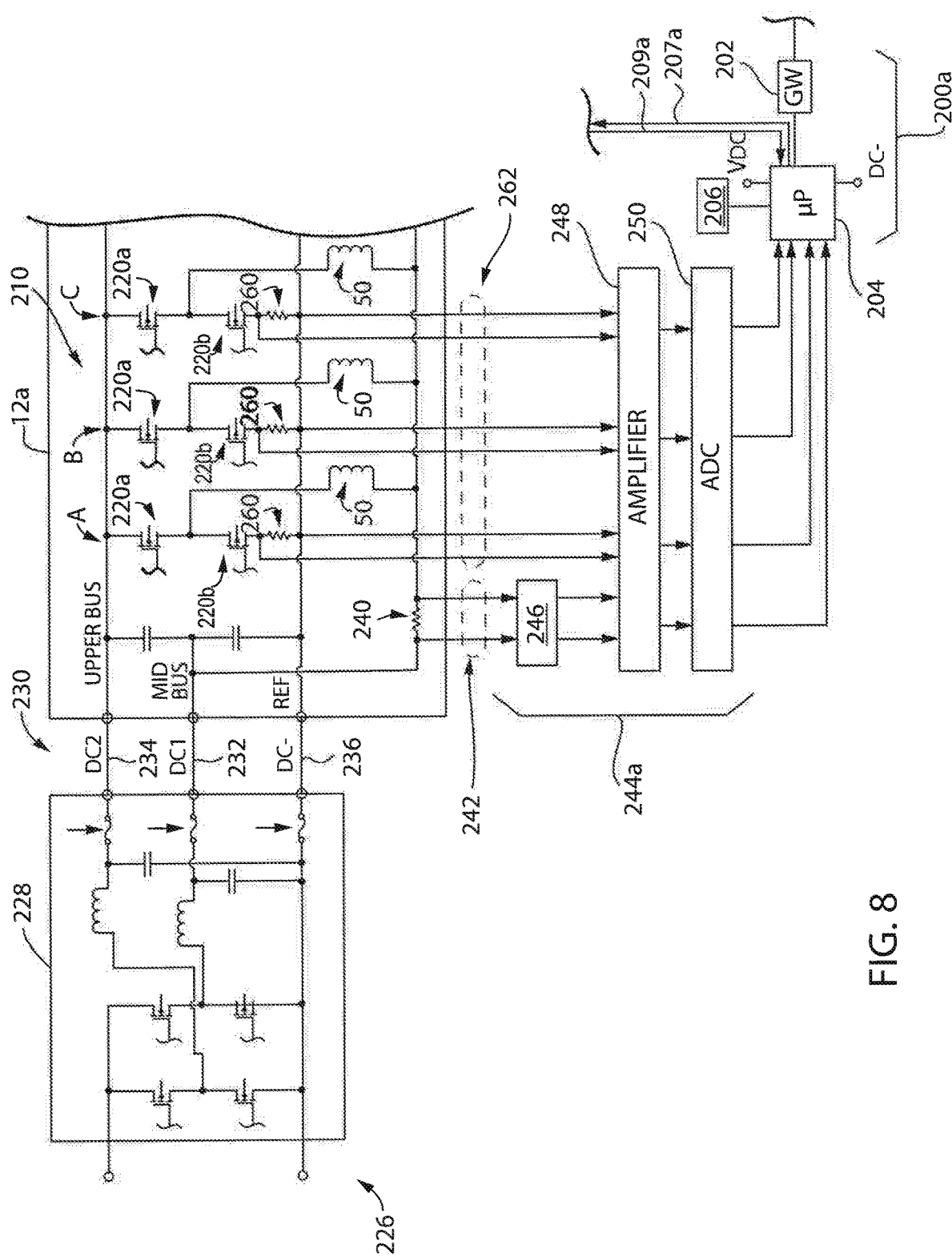
FIG. 8 is an exemplary schematic for a portion of the power system of FIG. 7.

With additional reference to FIG. 8, each segment controller 200 generates switching signals 207 to control operation of switching devices within one or more power segments 210 mounted within the track segment 12. The processor 204 receives feedback signals 209 from the position magnet 130 providing an indication of the current operating conditions within the power segment 210 or the current operating conditions of a coil 50 connected to the power segment 210. The switching devices within each power segment 210 are connected between a power source and the coils 50. The switching signals are generated to sequentially energize coils 50 along a track segment, where the energized coils 50 create an electromagnetic field that interacts with the drive magnets 140 on each mover 100 to control motion of the movers 100 along the corresponding track segment 12. The switching signals 207 control operation of switching devices 220 in communication with the drive coils 50, including upper switch devices 220a and lower switching devices 220b. The switching devices 220 may be solid-state devices that are activated by the switching signals 207, including, but not limited to, transistors, such as insulated-gate bipolar transistors, thyristors, or silicon-controlled rectifiers.

According to the illustrated embodiment, an AC converter 222 (FIG. 7) can receive a single or multi-phase AC voltage 224 from a power grid. The AC converter 222, in turn, can provide a DC voltage 226 using, for example, a rectifier front end, at input terminals of a DC supply 228, which could be a DC-to-DC buck converter. The DC supply 228, in turn, can provide at input terminals of the segments 12 a distributed DC bus 230, including: (1) a mid-bus DC voltage rail 232 configured to provide half DC power, at a mid-bus voltage ("DC 1"), such as 200 V; (2) a full-bus DC voltage rail 234 configured to provide DC power at a full-bus voltage ("DC 2"), such as 400 V; and a DC reference voltage rail 236 configured to provide a DC-reference ("DC-"), such as ground (0 V). Although illustrated external to the track segment 12, it is contemplated that the DC bus 230 would extend within the segments 12. Each segment 12 includes connectors to which either the DC supply or another track segment may be connected such that the DC bus 230 may extend for the length of the track 10. Optionally, each track segment 12 may be configured to include a rectifier section (not shown) and receive an AC voltage input. The rectifier section in each track segment 12 may convert the AC voltage to the DC bus 230 utilized by the corresponding track segment. It is contemplated that the polarities and magnitudes of the various rails of the DC bus 230 may vary within the scope of the invention.

In each power segments 210, the processor 204 can drive the switching signals 207 to control the various switching devices 220 to provide power to respective coils 50 for propelling a mover 100 while continuously receiving feedback signals 209 for determining positions of the mover 100. For example, in a first leg "A," the processor 204 can drive the upper and lower switching devices 220a and 220b, respectively, to control a corresponding coil 50 in the first leg A to propel the mover 100. The processor 204 can detect movement of the mover 100 from the first leg A toward an area corresponding to the second leg "B" via the feedback signals 209. The processor 204 can then drive the upper and lower switching devices 220a and 220b, respectively, to control a corresponding coil 50 in the second leg B to continue propelling the mover 100, according to a predetermined motion profile. In each leg, the lower switching devices 220b can be coupled to the DC-voltage rail 236, the upper switching device 220a can be coupled to the hill-bus DC voltage rail 234, and the coil 50 can be coupled between the upper and lower switching devices 220a and 220b, respectively, on a first side and the mid-bus DC-voltage rail 232 on a second side. Accordingly, the switching devices 220 in each leg can be configured to connect a coil 50 in the leg between rails of the DC bus 230 in various states, such as the upper switching devices 220a connecting or disconnecting full-bus DC voltage rail 234 to a coil 50 causing positive current flow in coil 50, and/or the lower switching device 220b connecting or disconnecting DC-voltage rail 236 to a coil 50 causing negative current flow in coil 50.

In accordance with an aspect of the invention, a single power sensor 240 can be arranged in a segment 12 between the coils 50 and the mid-bus DC voltage rail 232 to detect a mid-bus current in the segment 12 in an erroneous state. Accordingly, the power sensor 240 can be configured to produce a power sensor output 242 corresponding to a current between the drive coils 50 and the mid-bus DC voltage rail 232. The power sensor 240 can detect a coil 50 to ground failure and/or a failure of an upper device 220a to the hall-bus DC voltage rail 234. In another aspect of the invention, multiple power sensors 240 can be used, in series along the mid-bus DC voltage rail 232, between groups of coils 50, with each power sensor providing current sensing for two or more coils 50. The power sensor output 242 can be provided to signal conditioning circuitry 244 and, in turn, the processor 204 for the segment 12. The signal conditioning circuitry 244 can include an isolation circuit 246, which could include an optical diode or other component providing an electrical separation between field components (such as the track 10) and processing components (such as the segment controller 200) by corresponding electrical signaling to light transmissions, followed by an amplifier 248 and/or Analog-to-Digital Converter (ADC) 250.

The processor 204, in turn, can execute a program stored in memory device 206 to compare the power sensor output 242 to a predetermined power current threshold, which may also be stored in in memory device 206. The processor 204 can compare with respect to a magnitude of current in the mid-bus DC voltage rail 232, such as a, current exceeding 25 Amperes. If the processor 204 determines that the power sensor output 242 indicates a current that exceeds the predetermined power current threshold, the processor 204 can produce an alert which may be received by the system controller 30. In an alternative aspect, the processor 204 can compare with respect to a direction of the current in the mid-bus DC voltage rail 232. Also, if the processor 204 determines that the power sensor output 242 indicates a current that differs with respect to a direction of the predetermined power current, the processor 204 can again produce an alert which may be received by the system controller 30. Alternatively, the processor 204 can stop the switching of the 220a and 220b switches in order to prevent adverse effects in the system The power sensor 240 could be a resistor, for example, in which the power sensor output 242 is provided via sensing lines on opposing sides of the resistor. However, in another aspect, the power sensor 240 could be a Hall effect current transducer.

In accordance with another aspect of the invention, one or more reference sensors 260 can be arranged in a segment 12 between lower switching devices 220b and the DC-reference voltage rail 236 to detect reference currents in the segment 12 in an erroneous state. Accordingly, the reference sensors 260 can be configured to produce reference sensor outputs 262 corresponding to currents between the lower switching devices 220b and the DC-reference voltage rail 236. The reference sensors 260 can detect failures of upper switch switching devices 220a when corresponding lower switching devices 220b are activated. The reference sensors 260 can also be provided to the signal conditioning circuitry 244 and, in turn, the processor 204 for the segment 12. However, unlike the power sensor output 242, in one aspect, the reference sensor outputs 262 can bypass the isolation circuit 246 of the signal conditioning circuitry 244 by also referencing the processor 204 to the DC-reference voltage rail 236. For example, ground pins of the processor 204 could be connected to the DC-reference voltage rail 236 from the DC supply 228. Consequently, by referencing the processor 204 to the same rail as the DC reference voltage, the reference sensors 260 can produce outputs to the processor 204 without requiring isolation. Accordingly, the reference sensor outputs 262 can be provided to the amplifier 248, the Analog-to-Digital Converter (ADC) 250, and/or the processor 204, without isolation.

The processor 204, in turn, can execute a program stored in memory device 206 to compare the reference sensor outputs 262 to a predetermined reference current threshold, which may also be stored in in memory device 206. The processor 204 can compare with respect to a magnitude of current in the DC-reference voltage rail 236, such as a current exceeding 12.5 Amperes. If the processor 204 determines that one or more of the reference sensor outputs 262 indicates a current that exceeds the predetermined reference current threshold, the processor 204 can produce an alert which may be received by the system controller 30. In an alternative aspect, the processor 204 can compare with respect to a direction of the current in the DC-reference voltage rail 236. Also, if the processor 204 determines that one or more of the reference sensor outputs 262 indicates a current that differs with respect to a direction of the predetermined power current, the processor 204 can again produce an alert which may be received by the system controller 30.

The reference sensors 260 could be resistors, for example, in which the reference sensor outputs 262 are provided via sensing lines on opposing sides of the resistors. However, in another aspect, the reference sensors 260 could be Hall effect current transducers.

Also, it is contemplated that various portions of the signal conditioning circuitry 244 and the processor 204 could be integrated in various ways within the scope of the invention. As a result, numerous short circuit conditions can be detected at each segment 12 with pinpoint accuracy while requiring minimal hardware resources.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

What is claimed is:

1. A track segment for a linear motor drive system, the track segment comprising:
   a first DC voltage rail configured to provide DC power;
   a second DC voltage rail configured to provide half DC power;
   a third DC voltage rail configured to provide a DC-reference;
   a plurality of drive coils spaced along the track segment, the plurality of drive coils being coupled to the second DC voltage rail;
   a plurality of first switches in communication with the plurality of drive coils, the plurality of first switches being coupled to the third DC voltage rail, wherein each switch of the plurality of first switches is configured to connect a drive coil of the plurality of drive coils to the third DC voltage rail in a first state or disconnect the drive coil of the plurality of drive coils from the third DC voltage rail in a second state;
   a plurality of second switches in communication with the plurality of drive coils, the plurality of second switches being coupled to the first DC voltage rail, wherein each switch of the plurality of second switches is configured to connect a drive coil of the plurality of drive coils to the first DC voltage rail in the second state or disconnect the drive coil of the plurality of drive coils from the first DC voltage rail in the first state; and a sensor arranged between the plurality of drive coils and the second DC voltage rail, the sensor being configured to produce an output corresponding to a current between the plurality of drive coils and the second DC voltage rail.

2. The track segment of claim 1, further comprising a processor in communication with the sensor, the processor executing a program stored in a non-transient medium to compare the output to a predetermined current threshold and produce an alert when the output exceeds the predetermined current threshold.

3. The track segment of claim 2, further comprising an isolation circuit arranged between the sensor and the processor, wherein the processor receives the output through isolation.

4. The track segment of claim 3, wherein the isolation circuit is an optical isolation circuit.

5. The track segment of claim 1, wherein the sensor is a DC power sensor, and further comprising a DC reference sensor arranged between a switch of the plurality of first switches and the third DC voltage rail, the DC reference sensor being configured to produce an output corresponding to a current between the switch of the first plurality of switches and the third DC voltage rail.

6. The track segment of claim 5, further comprising a processor in communication with the DC power sensor and the DC reference sensor, the processor executing a program stored in a non-transient medium to compare the output of the DC power sensor to a first predetermined current threshold, compare the output of the DC reference sensor to a second predetermined current threshold and produce an alert when the output of the DC power sensor exceeds the first predetermined current threshold or the output of the DC reference sensor exceeds the second predetermined current threshold.

7. The track segment of claim 6, further comprising an isolation circuit arranged between the DC power sensor and the processor, wherein the processor receives the output of the DC power sensor through isolation, and wherein the processor receives the output of the DC reference sensor without isolation.

8. The track segment of claim 7, wherein the processor is coupled to the third DC voltage rail.

9. The track segment of claim 8, wherein the third DC voltage rail is ground.

10. The track segment of claim 1, wherein the switches are insulated-gate bipolar transistors.

11. The track segment of claim 1, wherein the sensor is a resistor.

12. The track segment of claim 1, wherein the sensor is a Hall effect current transducer.

13. A track segment for a linear motor drive system, the track segment comprising:

a first DC voltage rail configured to provide DC power;

a second DC voltage rail configured to provide half DC reference;

a third DC voltage rail configured to provide a DC-reference;

a plurality of drive coils spaced along the track segment, the plurality of drive coils being coupled to the second DC voltage rail;

a plurality of first switches in communication with the plurality of drive coils, the plurality of first switches being coupled to the third DC voltage rail, wherein each switch of the plurality of first switches is configured to connect a drive coil of the plurality of drive coils to the third DC voltage rail in a first state or disconnect the drive coil of the plurality of drive coils from the third DC voltage rail in a second state;

a plurality of second switches in communication with the plurality of drive coils, the plurality of second switches being coupled to the first DC voltage rail, wherein each switch of the plurality of second switches is configured to connect a drive coil of the plurality of drive coils to the first DC voltage rail in the second state or disconnect the drive coil of the plurality of drive coils from the first DC voltage rail in the first state;

a plurality of DC reference sensors arranged between the plurality of first switches and the third DC voltage rail, each DC reference sensor of the plurality of DC reference sensors being configured to produce an output corresponding to a current between a switch of the plurality of first switches and the third DC voltage rail; and a DC power sensor arranged between the plurality of drive coils and the second DC voltage rail, the DC power sensor being configured to produce an output corresponding to a current between the plurality of drive coils and the second DC voltage rail.

14. The track segment of claim 13, further comprising a processor in communication with the plurality of DC reference sensors, the processor executing a program stored in a non-transient medium to compare outputs of the plurality of DC reference sensors to a predetermined current threshold and produce an alert when an output exceeds the predetermined current threshold.

15. The track segment of claim 13, wherein the processor is further in communication with the DC power sensor, the processor executing a program stored in a non-transient medium to compare the output of the DC power sensor to a second predetermined current threshold and produce an alert when the output of the DC power sensor exceeds the second predetermined current threshold.

16. The track segment of claim 15, further comprising an isolation circuit arranged between the DC power sensor and the processor, wherein the processor receives the output of the DC power sensor through isolation, and wherein the processor receives outputs of the plurality of DC reference sensors without isolation.

17. The track segment of claim 16, wherein the isolation circuit is an optical isolation circuit.

* * * * *